(12) United States Patent
Miyase et al.

(10) Patent No.: US 12,020,924 B2
(45) Date of Patent: Jun. 25, 2024

(54) SILICON CARBIDE EPITAXIAL SUBSTRATE AND METHOD OF MANUFACTURING SILICON CARBIDE SEMICONDUCTOR DEVICE

(71) Applicant: Sumitomo Electric Industries, Ltd., Osaka (JP)

(72) Inventors: Takaya Miyase, Osaka (JP); Tsutomu Hori, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 856 days.

(21) Appl. No.: 17/053,655

(22) PCT Filed: Mar. 15, 2019

(86) PCT No.: PCT/JP2019/010725
§ 371 (c)(1),
(2) Date: Nov. 6, 2020

(87) PCT Pub. No.: WO2019/216024
PCT Pub. Date: Nov. 14, 2019

(65) Prior Publication Data
US 2021/0225646 A1 Jul. 22, 2021

(30) Foreign Application Priority Data
May 9, 2018 (JP) ................................ 2018-090301

(51) Int. Cl.
*H01L 21/02* (2006.01)
*C30B 29/36* (2006.01)
(Continued)

(52) U.S. Cl.
CPC ........ *H01L 21/02378* (2013.01); *C30B 29/36* (2013.01); *H01L 21/02433* (2013.01);
(Continued)

(58) Field of Classification Search
None
See application file for complete search history.

(56) References Cited

U.S. PATENT DOCUMENTS 10,700,169 B2 * 6/2020 Hori ...................... H01L 29/045
2009/0302326 A1 12/2009 Maruyama
(Continued)

FOREIGN PATENT DOCUMENTS

| JP | 2006-321707 A | 11/2006 |
| JP | 2013-038099 A | 2/2013 |

(Continued)

*Primary Examiner* — Michael Lebentritt
(74) *Attorney, Agent, or Firm* — McCarter & English, LLP; Michael A. Sartori

(57) ABSTRACT

The composite defect includes an extended defect and a basal plane dislocation. The extended defect includes a first region extending in a <11-20> direction from an origin located at a boundary between the silicon carbide substrate and the silicon carbide epitaxial film, and a second region extending along a <1-100> direction. The first region has a width in the <1-100> direction that increases from the origin toward the second region. The basal plane dislocation includes a third region continuous to the origin and extending along the <1-100> direction, and a fourth region extending along a direction intersecting the <1-100> direction. When an area of the main surface is a first area, and an area of a quadrangle circumscribed around the composite defect is a second area, a value obtained by dividing the second area by the first area is not more than 0.001.

6 Claims, 11 Drawing Sheets

(51) Int. Cl.
*H01L 29/04* (2006.01)
*H01L 29/16* (2006.01)

(52) U.S. Cl.
CPC .. *H01L 21/02529* (2013.01); *H01L 21/02609* (2013.01); *H01L 21/0262* (2013.01); *H01L 29/045* (2013.01); *H01L 29/1608* (2013.01)

(56) References Cited

U.S. PATENT DOCUMENTS

| | | |
|---|---|---|
| 2011/0006309 A1 | 1/2011 | Momose et al. |
| 2016/0355949 A1 | 12/2016 | Wada et al. |
| 2017/0314160 A1 | 11/2017 | Ohno et al. |
| 2018/0363166 A1 | 12/2018 | Wada et al. |
| 2019/0019868 A1 | 1/2019 | Wada et al. |
| 2019/0245044 A1 | 8/2019 | Hori |
| 2022/0028688 A1* | 1/2022 | Sakai ................... C30B 25/186 |

FOREIGN PATENT DOCUMENTS

| | | | |
|---|---|---|---|
| JP | 2014-120721 A | | 6/2014 |
| JP | 2016-102061 A | | 6/2016 |
| JP | 2016-171348 A | | 9/2016 |
| JP | 2017-076650 A | | 4/2017 |
| JP | 2017-084989 A | | 5/2017 |
| JP | 2017-145150 A | | 8/2017 |
| JP | 2017-199810 A | | 11/2017 |
| JP | 6233555 B1 | | 11/2017 |
| JP | 2022060389 A | * | 4/2022 |
| WO | 2009/035095 A1 | | 3/2009 |
| WO | WO-2022097386 A1 | * | 5/2022 |

* cited by examiner

SILICON CARBIDE EPITAXIAL SUBSTRATE AND METHOD OF MANUFACTURING SILICON CARBIDE SEMICONDUCTOR DEVICE

TECHNICAL FIELD

The present disclosure relates to a silicon carbide epitaxial substrate and a method of manufacturing a silicon carbide semiconductor device. The present application claims priority to Japanese Patent Application No. 2018-090301 filed on May 9, 2018, the entire contents of which are incorporated herein by reference.

BACKGROUND ART

WO 2009/035095 (PTL 1) discloses a silicon carbide single-crystal substrate, in which a dislocation array density of threading edge dislocation arrays is 10 arrays/cm$^2$ or less.

CITATION LIST

Patent Literature

PTL 1: WO 2009/035095

SUMMARY OF INVENTION

A silicon carbide epitaxial substrate according to the present disclosure includes a silicon carbide substrate, a silicon carbide epitaxial film, and a composite defect. The silicon carbide epitaxial film is on the silicon carbide substrate. The composite defect is in the silicon carbide epitaxial film. A main surface of the silicon carbide epitaxial film is a surface inclined at an off angle of not less than 2° and not more than 6° relative to a {0001} plane. The composite defect includes an extended defect and a basal plane dislocation. The extended defect includes a first region extending in a <11-20> direction from an origin located at a boundary between the silicon carbide substrate and the silicon carbide epitaxial film, and a second region extending along a <1-100> direction. The first region has a width in the <1-100> direction that increases from the origin toward the second region. The extended defect is made of silicon carbide having a polytype different from a polytype of silicon carbide forming the silicon carbide epitaxial film. The basal plane dislocation includes a third region continuous to the origin and extending along the <1-100> direction, and a fourth region extending along a direction intersecting the <1-100> direction. When viewed in a direction perpendicular to the main surface, an end portion of the fourth region is located on a straight line along the second region. When an area of the main surface is a first area, and an area of a quadrangle circumscribed around the composite defect is a second area, a value obtained by dividing the second area by the first area is not more than 0.001.

A silicon carbide epitaxial substrate according to the present disclosure includes a silicon carbide substrate and a silicon carbide epitaxial film. The silicon carbide epitaxial film is on the silicon carbide substrate and has a thickness of not less than 15 µm. A main surface of the silicon carbide epitaxial film is a surface inclined at an off angle of not less than 2° and not more than 6° relative to a {0001} plane. The silicon carbide epitaxial substrate does not have a composite defect. The composite defect includes an extended defect and a basal plane dislocation. The extended defect includes a first region extending in a <11-20> direction from an origin located at a boundary between the silicon carbide substrate and the silicon carbide epitaxial film, and a second region extending along a <1-100> direction. The first region has a width in the <1-100> direction that increases from the origin toward the second region. The extended defect is made of silicon carbide having a polytype different from a polytype of silicon carbide forming the silicon carbide epitaxial film. The basal plane dislocation includes a third region continuous to the origin and extending along the <1-100> direction, and a fourth region extending along a direction intersecting the <1-100> direction. When viewed in a direction perpendicular to the main surface, an end portion of the fourth region is located on a straight line along the second region.

DETAILED DESCRIPTION

Figure 1:
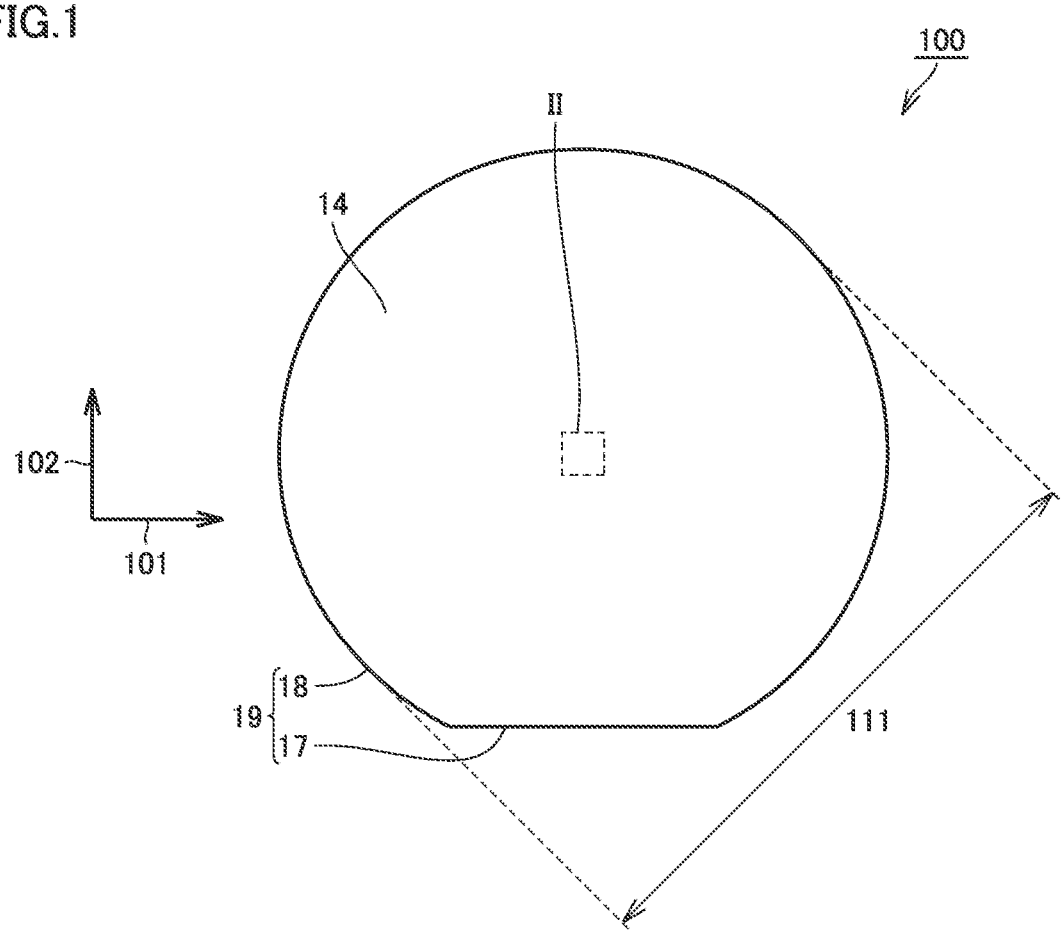
FIG. 1 is a schematic plan view showing the configuration of a silicon carbide epitaxial substrate according to the present embodiment.

[Overview of Embodiment of the Present Disclosure]

An overview of an embodiment of the present disclosure is described first. Regarding crystallographic denotation herein, an individual orientation, a group orientation, an individual plane, and a group plane are shown in [ ], < >, ( ), and { }, respectively. A crystallographically negative index is normally expressed by a number with a bar "-" thereabove, however, a negative sign herein precedes a number.

(1) A silicon carbide epitaxial substrate 100 according to the present disclosure includes a silicon carbide substrate 10, a silicon carbide epitaxial film 20, and a composite defect 3. Silicon carbide epitaxial film 20 is on silicon carbide substrate 10. Composite defect 3 is in silicon carbide epitaxial film 20. A main surface 14 of silicon carbide epitaxial film 20 is a surface inclined at an off angle of not less than 2° and not more than 6° relative to a {0001} plane. Composite defect 3 includes an extended defect 30 and a basal plane dislocation 40. Extended defect 30 includes a first region 34 extending in a <11-20> direction from an origin 1 located at a boundary between silicon carbide substrate 10 and silicon carbide epitaxial film 20, and a second region 33 extending along a <1-100> direction. First region 34 has a width in the <1-100> direction that increases from origin 1 toward second region 33. Extended defect 30 is made of silicon carbide having a polytype different from a polytype of silicon carbide forming silicon carbide epitaxial film 20. Basal plane dislocation 40 includes a third region 47 continuous to origin 1 and extending along the <1-100> direction, and a fourth region 48 extending along a direction intersecting the <1-100> direction. When viewed in a direction perpendicular to main surface 14, an end portion 49 of fourth region 48 is located on a straight line 4 along second region 33. When an area of main surface 14 is a first area, and an area of a quadrangle 5 circumscribed around composite defect 3 is a second area, a value obtained by dividing the second area by the first area is not more than 0.001.

(2) In silicon carbide epitaxial substrate 100 according to (1), silicon carbide epitaxial film 20 may have a thickness of not less than 15 μm.

(3) In silicon carbide epitaxial substrate 100 according to (1) or (2), there may be silicon carbide particles at origin 1.

(4) In silicon carbide epitaxial substrate 100 according to (1) or (2), there may be carbon particles at origin 1.

(5) In silicon carbide epitaxial substrate 100 according to any one of (1) to (4), composite defect 3 may be located within a circle 16 centered at a center 2 of main surface 14 and having a radius which is two-thirds a radius of main surface 14.

(6) A method of manufacturing a silicon carbide semiconductor device according to the present disclosure includes preparing silicon carbide epitaxial substrate 100 according to any one of (1) to (5), and processing silicon carbide epitaxial substrate 100.

(7) A silicon carbide epitaxial substrate 100 according to the present disclosure includes a silicon carbide substrate 10 and a silicon carbide epitaxial film 20. Silicon carbide epitaxial film 20 on silicon carbide substrate 10 and has a thickness of not less than 15 μm. A main surface 14 of silicon carbide epitaxial film 20 is a surface inclined at an off angle of not less than 2° and not more than 6° relative to a {0001} plane. Silicon carbide epitaxial substrate 100 does not have a composite defect 3. Composite defect 3 includes an extended defect 30 and a basal plane dislocation 40. Extended defect 30 includes a first region 34 extending in a <11-20> direction from an origin 1 located at a boundary between silicon carbide substrate 10 and silicon carbide epitaxial film 20, and a second region 33 extending along a <1-100> direction. First region 34 has a width in the <1-100> direction that increases from origin 1 toward second region 33. Extended defect 30 is made of silicon carbide having a polytype different from a polytype of silicon carbide forming silicon carbide epitaxial film 20. Basal plane dislocation 40 includes a third region 47 continuous to origin 1 and extending along the <1-100> direction, and a fourth region 48 extending along a direction intersecting the <1-100> direction. When viewed in a direction perpendicular to main surface 14, an end portion of fourth region 48 is located on a straight line along second region 33.

(8) A method of manufacturing a silicon carbide semiconductor device according to the present disclosure includes preparing silicon carbide epitaxial substrate 100 according to (7), and processing silicon carbide epitaxial substrate 100.

[Details of Embodiment of the Present Disclosure]

The details of the embodiment of the present disclosure are hereinafter described. In the description below, the same or corresponding elements are designated by the same reference symbols and the same description thereof will not be repeated.

(Silicon Carbide Epitaxial Substrate)

As shown in FIG. 1, a silicon carbide epitaxial substrate 100 according to the present embodiment includes a main surface 14 and an outer edge portion 19. Main surface 14 spreads two-dimensionally along each of a first direction 101 and a second direction 102. Outer edge portion 19 surrounds main surface 14. Outer edge portion 19 includes an orientation flat 17 and an arc-shaped portion 18, for example. Orientation flat 17 extends along first direction 101. Arc-shaped portion 18 is continuous to orientation flat 17.

Second direction 102 is a <1-100> direction, for example. The second direction may be a [1-100] direction, for example. First direction 101 is a direction parallel to main surface 14 and perpendicular to second direction 102. First direction 101 is a direction including a <11-20> direction component, for example. From a different viewpoint, the first direction is a direction defined by projecting a <11-20> direction on a plane parallel to main surface 14. First direction 101 may be a direction including a [11-20] direction component, for example. As shown in FIG. 1, main surface 14 has a maximum diameter 111 (diameter) of not less than 150 mm, for example. Maximum diameter 111 may be not less than 200 mm, or not less than 250 mm. The upper limit of maximum diameter 111 is not particularly limited. Maximum diameter 111 may be not more than 300 mm, for example.

Figure 2:
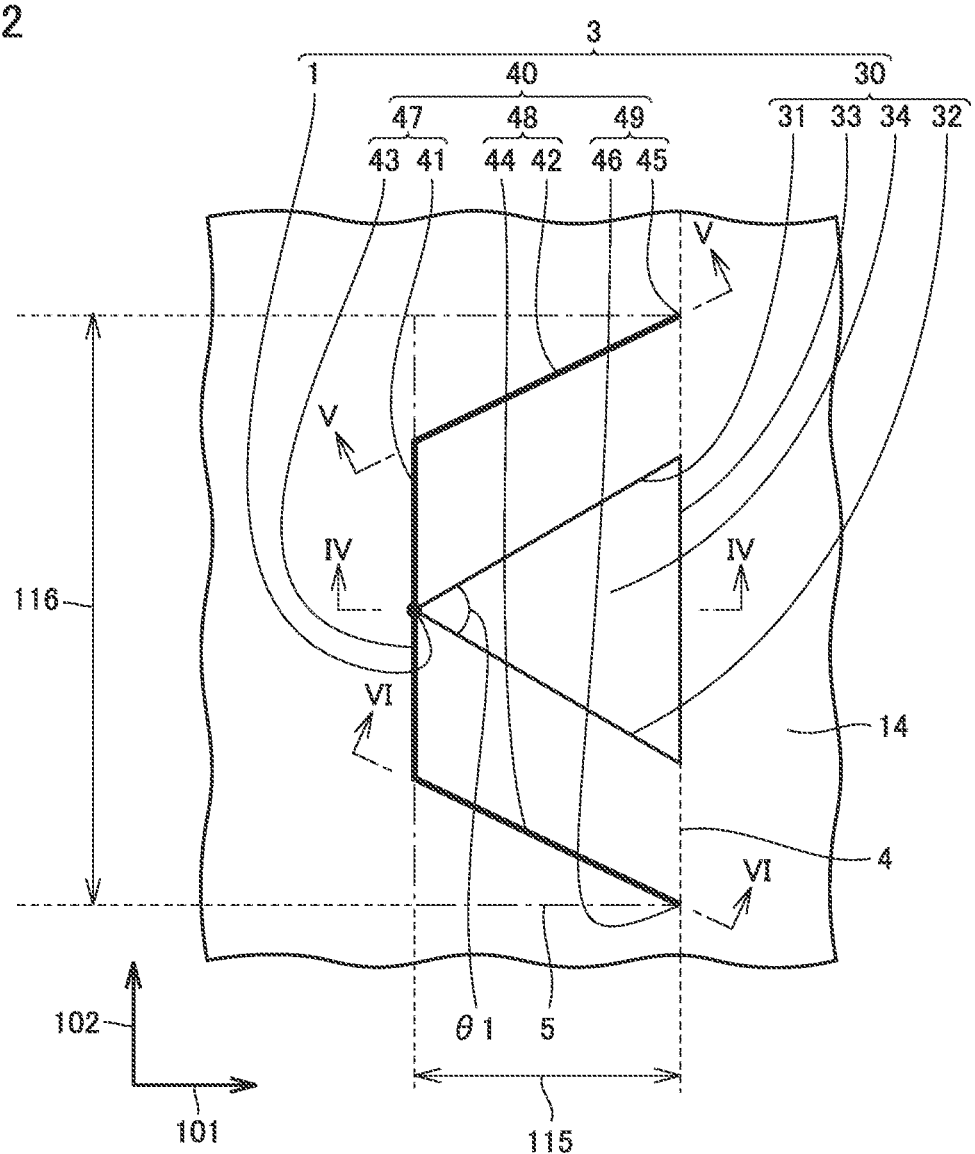
FIG. 2 is an enlarged schematic plan view of a region II in FIG. 1.
Figure 3:
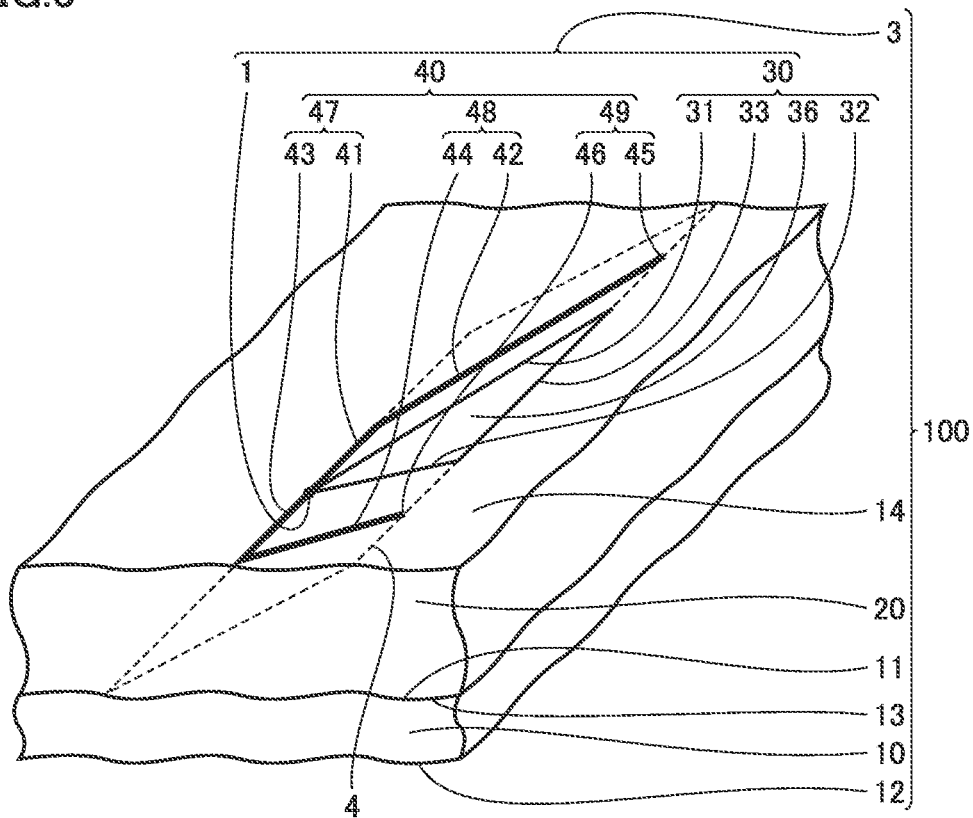
FIG. 3 is an enlarged schematic perspective view of region II in FIG. 1.
Figure 4:
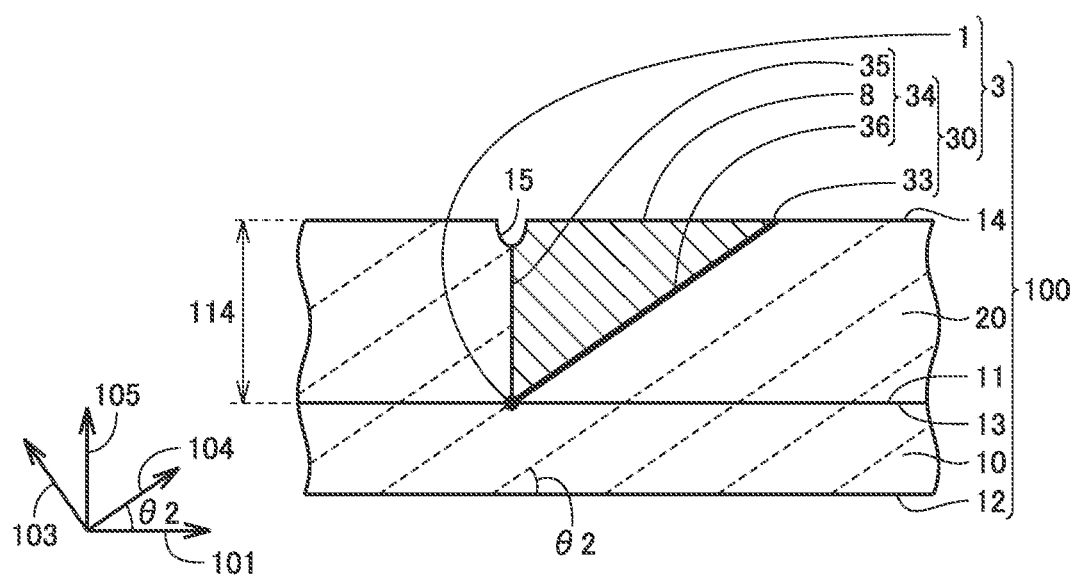
FIG. 4 is a schematic cross-sectional view along line IV-IV in FIG. 2.
Figure 5:
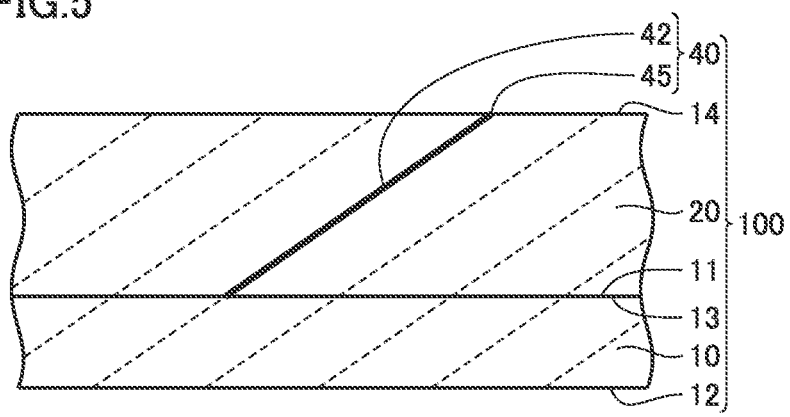
FIG. 5 is a schematic cross-sectional view along line V-V in FIG. 2.
Figure 6:
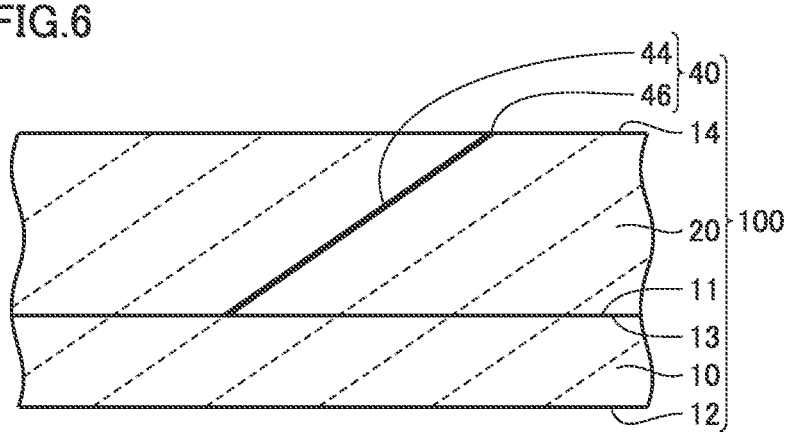
FIG. 6 is a schematic cross-sectional view along line VI-VI in FIG. 2.

FIG. 2 is an enlarged plan view of a region II in FIG. 1. FIG. 3 is an enlarged perspective view of region II in FIG. 1. FIG. 4 is a schematic cross-sectional view along line IV-IV in FIG. 2. FIG. 5 is a schematic cross-sectional view along line V-V in FIG. 2. FIG. 6 is a schematic cross-sectional view along line VI-VI in FIG. 2.

As shown in FIG. 2, silicon carbide epitaxial substrate 100 has a composite defect 3. Composite defect 3 consists of an extended defect 30, a basal plane dislocation 40, and an origin 1. As shown in FIG. 2, when viewed in a direction perpendicular to main surface 14, composite defect 3 is surrounded by a silicon carbide epitaxial film 20. Extended defect 30 is made of silicon carbide having a polytype different from a polytype of silicon carbide forming silicon carbide epitaxial film 20. The silicon carbide forming silicon carbide epitaxial film 20 has a polytype of 4H, for example. The silicon carbide forming extended defect 30 has a polytype of 3C, for example. The polytype of the silicon carbide forming extended defect 30 should only be different from the polytype of the silicon carbide forming silicon carbide epitaxial film 20, and is not limited to 3C. The silicon carbide forming extended defect 30 may have a polytype of 6H, for example.

As shown in FIGS. 2 and 3, extended defect 30 includes a first region 34 and a second region 33. As shown in FIG. 2, first region 34 has a width in the <1-100> direction that increases from origin 1 toward second region 33. The <11-20> direction when viewed in the direction perpendicular to main surface 14 is a direction defined by projecting the <11-20> direction on a plane parallel to main surface 14. First region 34 includes a first side portion 31 and a second side portion 32. First region 34 is located between first side portion 31 and second side portion 32. An angle θ1 formed between first side portion 31 and second side portion 32 is not less than 45° and not more than 135°, for example.

Each of first side portion 31 and second side portion 32 is inclined relative to first direction 101. A direction of inclination of first side portion 31 relative to first direction 101 is opposite to a direction of inclination of second side portion 32 relative to first direction 101. Each of first side portion 31 and second side portion 32 is continuous to origin 1. As shown in FIG. 2, when viewed in the direction perpendicular to main surface 14, spacing between first side portion 31 and second side portion 32 along the second direction increases toward first direction 101.

As shown in FIG. 2, when viewed in the direction perpendicular to main surface 14, second region 33 extends along the <1-100> direction. The <1-100> direction when viewed in the direction perpendicular to main surface 14 is a direction defined by projecting the <1-100> direction on a plane parallel to main surface 14. Second region 33 may be continuous to each of first side portion 31 and second side portion 32. Second region 33 may be continuous to main surface 14. As shown in FIG. 2, when viewed in the direction perpendicular to main surface 14, a region surrounded by first side portion 31, second side portion 32 and second region 33 may be a triangle.

As shown in FIGS. 4 to 6, silicon carbide epitaxial substrate 100 includes a silicon carbide substrate 10 and silicon carbide epitaxial film 20. Silicon carbide epitaxial film 20 is on silicon carbide substrate 10. Silicon carbide substrate 10 has a first main surface 11, and a second main surface 12 opposite to first main surface 11. Silicon carbide epitaxial film 20 is in contact with first main surface 11. Silicon carbide epitaxial film 20 has a third main surface 13 in contact with first main surface 11, and main surface 14 opposite to third main surface 13. Silicon carbide forming each of silicon carbide substrate 10 and silicon carbide epitaxial film 20 has a polytype of 4H, for example. Composite defect 3 is in silicon carbide epitaxial film 20. Composite defect 3 is in contact with silicon carbide epitaxial film 20. Composite defect 3 is located on silicon carbide substrate 10.

Silicon carbide substrate 10 is made of a silicon carbide single crystal, for example. Silicon carbide substrate 10 includes an n type impurity such as nitrogen (N). Silicon carbide substrate 10 has n type conductivity, for example. First main surface 11 is a surface inclined at an off angle of not less than 2° and not more than 6° relative to a {0001} plane. When first main surface 11 is inclined relative to the {0001} plane, a direction of inclination of first main surface 11 is the <11-20> direction, for example. Silicon carbide substrate 10 has a thickness of not less than 350 μm and not more than 500 μm, for example.

Silicon carbide epitaxial film 20 includes an n type impurity such as nitrogen. Silicon carbide epitaxial film 20 has n type conductivity, for example. A concentration of the n type impurity included in silicon carbide epitaxial film 20 may be lower than a concentration of the n type impurity included in silicon carbide substrate 10. The concentrations of the n type impurities are measured with, for example, a mercury probe C-V measurement device. The probe has an area of 0.005 cm², for example.

Main surface 14 of silicon carbide epitaxial film 20 is a surface inclined at an off angle θ2 of not less than 2° and not more than 6° relative to the {0001} plane. Specifically, main surface 14 is a surface inclined at off angle θ2 of not less than 2° and not more than 6° relative to a (0001) plane. Main surface 14 may be a surface inclined at off angle θ2 of not less than 2° and not more than 6° relative to a (000-1) plane. An off direction is the <11-20> direction, for example. The off direction is not limited to the <11-20> direction. The off direction may be, for example, the <1-100> direction, or a direction having a <1-100> direction component and a <11-20> direction component. Off angle θ2 is an angle of inclination of main surface 14 relative to the {0001} plane. Off angle θ2 may be not less than 3°. Off angle θ2 may be not more than 5°.

A plane indicated by dashed lines in FIGS. 4 to 6 is the {0001} plane. From a different viewpoint, the plane indicated by the dashed lines is a basal plane. A third direction 103 is a direction perpendicular to the 100011 plane. Third direction 103 is a direction, for example. A fourth direction 104 is a direction perpendicular to third direction 103. Fourth direction 104 is the <11-20> direction, for example. Fourth direction 104 may be a [11-20] direction, for example. Fourth direction 104 is the off direction, for example. A direction of the normal to main surface 14 is a fifth direction 105. The fifth direction is a direction inclined at off angle θ2 in the off direction relative to the direction, for example.

As shown in FIG. 4, first region 34 extends in the <11-20> direction from origin 1 located at a boundary between silicon carbide substrate 10 and silicon carbide epitaxial film 20. First region 34 includes an inclined portion 36, a side portion 35, and an upper end portion 8. Inclined portion 36 extends along the basal plane. Inclined portion 36 may be continuous to origin 1. Inclined portion 36 may be continuous to main surface 14. Inclined portion 36 is in contact with silicon carbide epitaxial film 20. Side portion 35 extends along a direction substantially perpendicular to main surface 14. Side portion 35 extends in a direction intersecting inclined portion 36. Side portion 35 may be continuous to origin 1. Upper end portion 8 may be continuous to inclined portion 33 in second region 33.

As shown in FIG. 4, at origin 1, there are particles continuous to extended defect 30. The particles are, for example, a downfall in particle form, formed by a deposition within a growth apparatus that fell to the surface of silicon carbide substrate 10. The particles are specifically silicon carbide particles or carbon particles. The particles have a diameter of not less than 1 μm and not more than 1 mm, for example. When the particles are made of silicon carbide, the silicon carbide of the particles may have a polytype different from the polytype of the silicon carbide forming silicon carbide epitaxial film 20.

As shown in FIG. 4, a recess 15 may be formed above origin 1. Recess 15 may be continuous to side portion 35 of extended defect 30. Each of recess 15 and origin 1 may be located on a straight line perpendicular to main surface 14. Recess 15 opens at the main surface 14 side. As shown in FIG. 4, silicon carbide epitaxial film 20 has a thickness 114 of not less than 15 μm, for example. Thickness 114 of silicon carbide epitaxial film 20 may be not less than 20 μm or not less than 30 μm, for example.

As shown in FIGS. 2 and 3, basal plane dislocation 40 includes a third region 47 and a fourth region 48. Third region 47 is continuous to origin 1. Third region 47 extends along the <1–100> direction. Third region 47 is formed of a one-side third region portion 41 and an other-side third region portion 43. One-side third region portion 41 extends from origin 1 along second direction 102. Other-side third region portion 43 extends from origin 1 in a direction opposite to second direction 102. Origin 1 is located between one-side third region portion 41 and other-side third region portion 43. Third region 47 is located at the boundary between silicon carbide substrate 10 and silicon carbide epitaxial film 20.

As shown in FIG. 2, fourth region 48 is continuous to third region 47. Fourth region 48 extends along a direction intersecting the <1–100> direction. As shown in FIG. 2, when viewed in the direction perpendicular to main surface 14, fourth region 48 may be inclined relative to each of first direction 101 and second direction 102. Fourth region 48 is formed of a one-side fourth region portion 42 and an other-side fourth region portion 44. One-side fourth region portion 42 is continuous to one-side third region portion 41. Other-side fourth region portion 44 is continuous to other-side third region portion 43. As shown in FIG. 2, when viewed in the direction perpendicular to main surface 14, extended defect 30 is provided between one-side fourth region portion 42 and other-side fourth region portion 44. A distance between one-side fourth region portion 42 and other-side fourth region portion 44 in a direction parallel to second direction 102 may increase toward first direction 101.

As shown in FIG. 5, one-side fourth region portion 42 extends from the third main surface to main surface 14. One-side fourth region portion 42 includes a one-side fourth region end portion 45. One-side fourth region end portion 45 is continuous to main surface 14. As shown in FIG. 6, other-side fourth region portion 44 extends from third main surface 13 to main surface 14. Other-side fourth region portion 44 includes an other-side fourth region end portion 46. Other-side fourth region end portion 46 is continuous to main surface 14.

As shown in FIG. 2, when viewed in the direction perpendicular to main surface 14, an end portion 49 of fourth region 48 is located on a straight line along second region 33. Specifically, when viewed in the direction perpendicular to main surface 14, a straight line 4 passing through one-side fourth region end portion 45 and other-side fourth region end portion 46 is along second region 33. When viewed in the direction perpendicular to main surface 14, straight line 4 passing through one-side fourth region end portion 45 and other-side fourth region end portion 46 is parallel to second direction 102. Second region 33 is located between one-side fourth region end portion 45 and other-side fourth region end portion 46.

Assume that the area of main surface 14 of silicon carbide epitaxial substrate 100 (see FIG. 1) is a first area. As shown in FIG. 2, assume that the area of a quadrangle 5 circumscribed around composite defect 3 is a second area. The quadrangle may be a rectangle, a square, or a trapezoid. When quadrangle 5 is a rectangle, second region 33 of extended defect 30 may be located at a long side 116 on one side of quadrangle 5. Third region 47 of basal plane dislocation 40 may be located at a long side 116 on the other side of quadrangle 5. Each of a pair of short sides 115 of quadrangle 5 may be parallel to first direction 101. If there are a plurality of composite defects 3, the sum of the area of quadrangle 5 circumscribed around each of the plurality of composite defects 3 is the second area. A value obtained by dividing the second area by the first area is not more than 0.001. The value obtained by dividing the second area by the first area may be not more than 0.0005, or not more than 0.0002.

Figure 7:
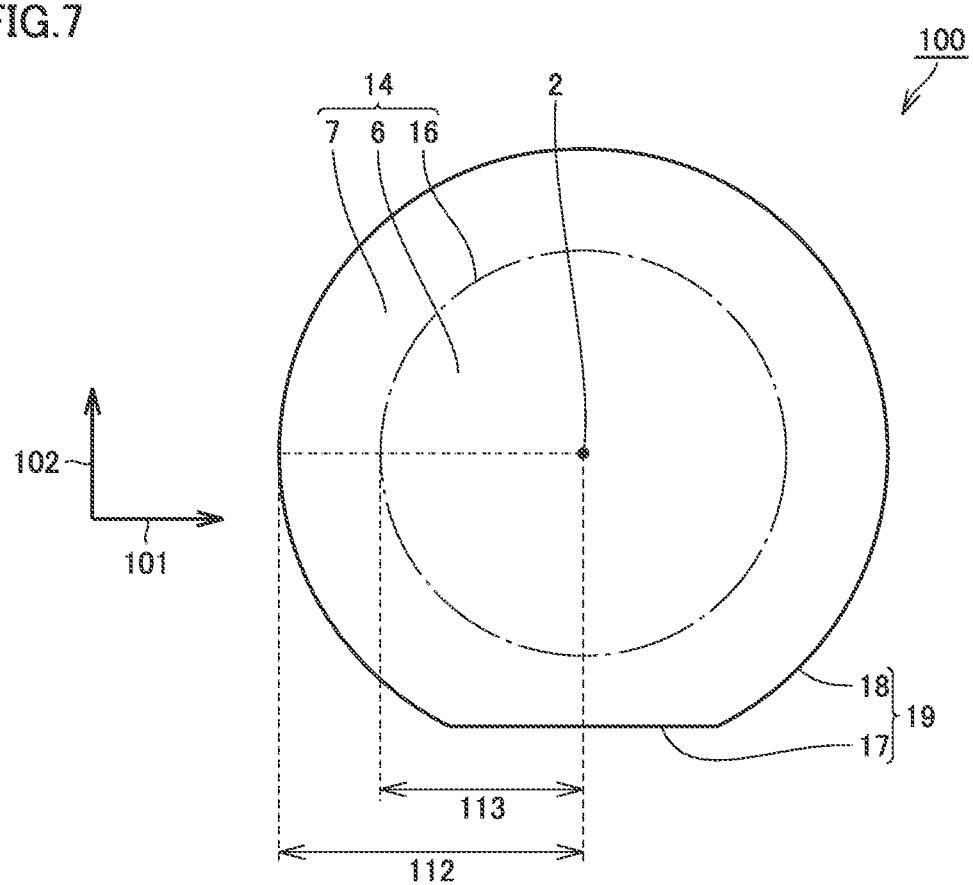
FIG. 7 is a schematic plan view showing an inner peripheral region and an outer peripheral region of the silicon carbide epitaxial substrate according to the present embodiment.

As shown in FIG. 7, assuming a circle 16 centered at a center 2 of main surface 14 and having a radius 113 which is two-thirds a radius 112 of main surface 14, composite defect 3 is located within circle 16. Main surface 14 includes an inner peripheral region 6 on the inner side of circle 16, and an outer peripheral region 7 on the outer side of circle 16. Outer peripheral region 7 surrounds inner peripheral region 6. Composite defect 3 is located in inner peripheral region 6. While composite defect 3 may be present in outer peripheral region 7, it is desirable that the area of quadrangle 5 circumscribed around composite defect 3 located in outer peripheral region 7 be smaller than the area of quadrangle 5 circumscribed around composite defect 3 located in inner peripheral region 6. If main surface 14 is a circle, center 2 of main surface 14 is the center of the circle. If main surface 14 is not a circle, center 2 of main surface 14 is the center of an equilateral triangle inscribed in arc-shaped portion 18.

A value obtained by dividing the area of quadrangle 5 circumscribed around composite defect 3 located in inner peripheral region 6 by the area of inner peripheral region 6 may be greater than a value obtained by dividing the area of quadrangle 5 circumscribed around composite defect 3 located in outer peripheral region 7 by the area of quadrangle 5 circumscribed around composite defect 3 located in outer peripheral region 7. Desirably, composite defect 3 is present only in inner peripheral region 6, and is not present in outer peripheral region 7. More desirably, silicon carbide epitaxial substrate 100 does not have composite defect 3. That is, composite defect 3 is not present in either outer peripheral region 7 or inner peripheral region 6.

Next, the configuration of silicon carbide epitaxial substrate 100 according to a modification of the present embodiment is described.

Figure 8:
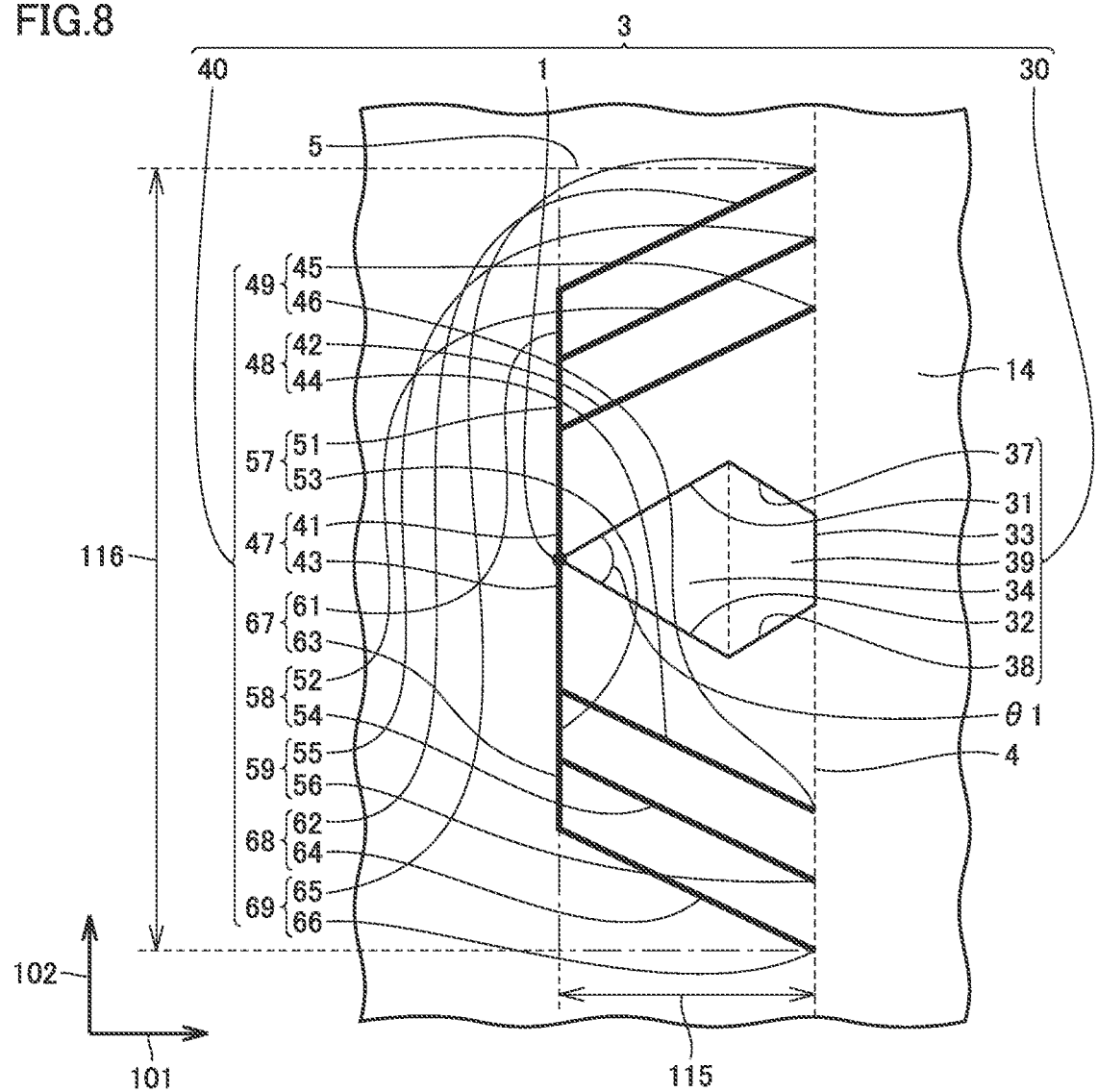
FIG. 8 is an enlarged schematic plan view showing the configuration of a modification of the silicon carbide epitaxial substrate according to the present embodiment.
Figure 9:
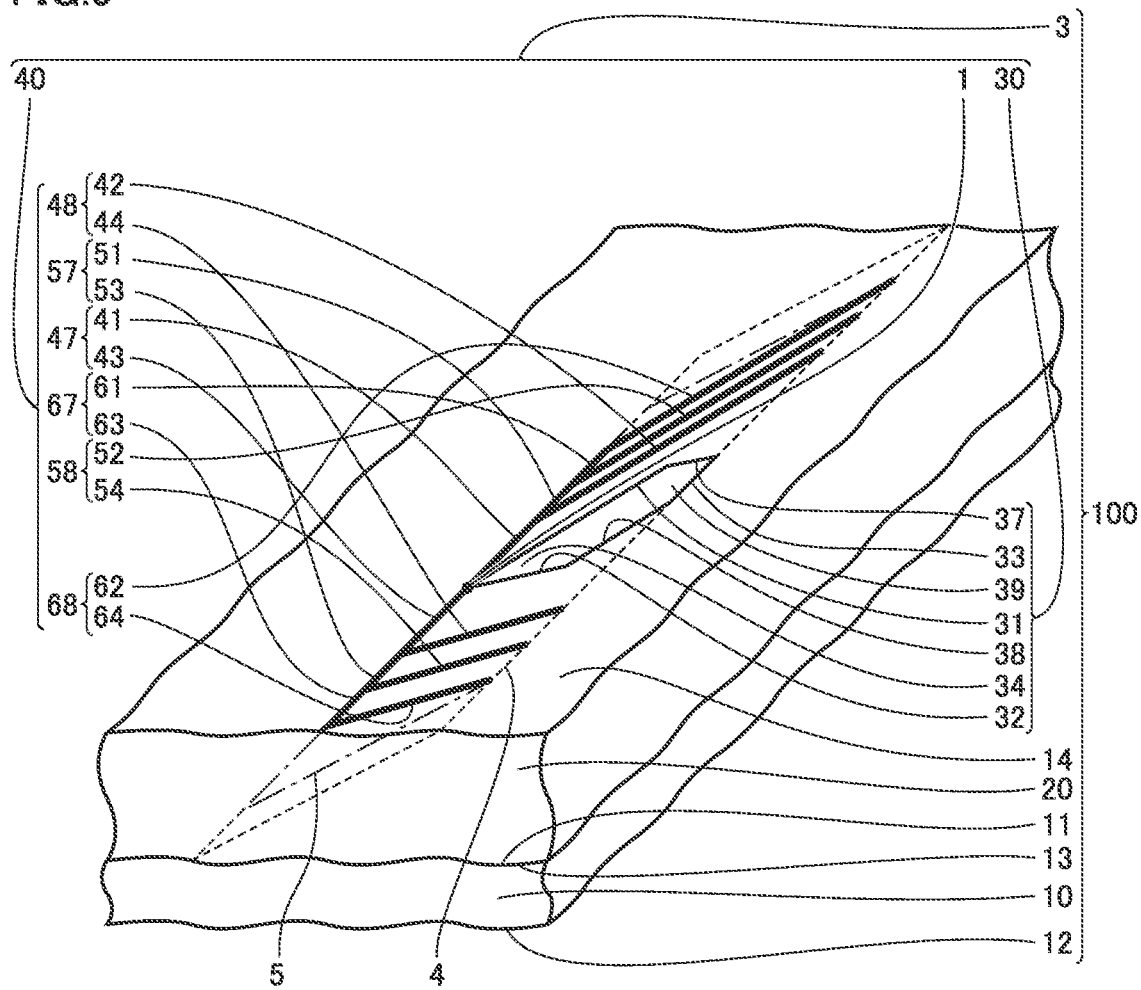
FIG. 9 is an enlarged schematic perspective view showing the configuration of the modification of the silicon carbide epitaxial substrate according to the present embodiment.

As shown in FIGS. 8 and 9, extended defect 30 may include first region 34, second region 33, and a fifth region 39. When viewed in the direction perpendicular to main surface 14, fifth region 39 has a trapezoidal shape, for example. Fifth region 39 is a region having a width in second direction 102 that decreases toward first direction 101. Fifth region 39 includes a third side portion 37 and a fourth side portion 38. Fifth region 39 is located between third side portion 37 and fourth side portion 38. Third side portion 37 is continuous to each of first side portion 31 and second region 33. Fourth side portion 38 is continuous to each of second side portion 32 and second region 33. Third side portion 37 is located between first side portion 31 and second region 33. Fourth side portion 38 is located between second side portion 32 and second region 33.

As shown in FIG. 8, when viewed in the direction perpendicular to main surface 14, third side portion 37 is inclined relative to first side portion 31. Similarly, fourth side portion 38 is inclined relative to second side portion 32. A direction of inclination of third side portion 37 relative to first direction 101 is opposite to a direction of inclination of fourth side portion 38 relative to first direction 101. As shown in FIG. 8, when viewed in the direction perpendicular to main surface 14, spacing between third side portion 37 and fourth side portion 38 along second direction 102 decreases toward first direction 101.

As shown in FIGS. 8 and 9, basal plane dislocation 40 may include third region 47, fourth region 48, a seventh region 57, an eighth region 58, a ninth region 67, and a tenth region 68. Seventh region 57 extends along the <1-100> direction. Seventh region 57 is formed of a one-side seventh region portion 51 and an other-side seventh region portion 53. One-side seventh region portion 51 is continuous to one-side third region portion 41. One-side seventh region portion 51 extends from one-side third region portion 41 along second direction 102. One-side third region portion 41 is located between one-side seventh region portion 51 and origin 1. Other-side seventh region portion 53 is continuous to other-side third region portion 43. Other-side seventh region portion 53 extends from other-side third region portion 43 in the direction opposite to second direction 102. Other-side third region portion 43 is located between other-side seventh region portion 53 and origin 1. Seventh region 57 is located at the boundary between silicon carbide substrate 10 and silicon carbide epitaxial film 20.

As shown in FIG. 8, eighth region 58 is continuous to seventh region 57. Eighth region 58 extends along the direction intersecting the <1-100> direction. Eighth region 58 is formed of a one-side eighth region portion 52 and an other-side eighth region portion 54. One-side eighth region portion 52 is continuous to one-side seventh region portion 51. Other-side eighth region portion 54 is continuous to other-side seventh region portion 53. As shown in FIG. 8, when viewed in the direction perpendicular to main surface 14, each of extended defect 30 and fourth region 48 is provided between one-side eighth region portion 52 and other-side eighth region portion 54. A distance between one-side eighth region portion 52 and other-side eighth region portion 54 in the direction parallel to second direction 102 may increase toward first direction 101.

As with one-side fourth region portion 42, one-side eighth region portion 52 extends from third main surface 13 to main surface 14. One-side eighth region portion 52 includes a one-side eighth region end portion 55. One-side eighth region end portion 55 is continuous to main surface 14. As with other-side fourth region portion 44, other-side eighth region portion 54 extends from third main surface 13 to main surface 14. Other-side eighth region portion 54 includes an other-side eighth region end portion 56. Other-side eighth region end portion 56 is continuous to main surface 14.

As shown in FIG. 8, when viewed in the direction perpendicular to main surface 14, an end portion 59 of eighth region 58 is located on the straight line along second region 33. Specifically, when viewed in the direction perpendicular to main surface 14, straight line 4 passing through one-side eighth region end portion 55 and other-side eighth region end portion 56 is along second region 33. When viewed in the direction perpendicular to main surface 14, straight line 4 passing through one-side eighth region end portion 55 and other-side eighth region end portion 56 is parallel to second direction 102. One-side fourth region end portion 45 is located between second region 33 and one-side eighth region end portion 55. Similarly, other-side fourth region end portion 46 is located between second region 33 and other-side eighth region end portion 56.

As shown in FIGS. 8 and 9, ninth region 67 extends along the <1-100> direction. Ninth region 67 is formed of a one-side ninth region portion 61 and an other-side ninth region portion 63. One-side ninth region portion 61 is continuous to one-side seventh region portion 51. One-side ninth region portion 61 extends from one-side seventh region portion 51 along second direction 102. One-side seventh region portion 51 is located between one-side ninth region portion 61 and one-side third region portion 41. Other-side ninth region portion 63 is continuous to other-side seventh region portion 53. Other-side ninth region portion 63 extends from other-side seventh region portion 53 in the direction opposite to second direction 102. Other-side seventh region portion 53 is located between other-side ninth region portion 63 and other-side third region portion 43. Ninth region 67 is located at the boundary between silicon carbide substrate 10 and silicon carbide epitaxial film 20.

As shown in FIG. 8, tenth region 68 is continuous to ninth region 67. Tenth region 68 extends along the direction intersecting the <1-100> direction. Tenth region 68 is formed of a one-side tenth region portion 62 and an other-side tenth region portion 64. One-side tenth region portion 62 is continuous to one-side ninth region portion 61. Other-side tenth region portion 64 is continuous to other-side ninth region portion 63. As shown in FIG. 8, when viewed in the direction perpendicular to main surface 14, each of extended defect 30, fourth region 48 and eighth region 58 is provided between one-side tenth region portion 62 and other-side tenth region portion 64. A distance between one-side tenth region portion 62 and other-side tenth region portion 64 in the direction parallel to second direction 102 may increase toward first direction 101.

As with one-side fourth region portion 42, one-side tenth region portion 62 extends from third main surface 13 to main surface 14. One-side tenth region portion 62 includes a one-side tenth region end portion 65. One-side tenth region end portion 65 is continuous to main surface 14. As with other-side fourth region portion 44, other-side tenth region portion 64 extends from third main surface 13 to main surface 14. Other-side tenth region portion 64 includes an other-side tenth region end portion 66. Other-side tenth region end portion 66 is continuous to main surface 14.

As shown in FIG. 8, when viewed in the direction perpendicular to main surface 14, an end portion 69 of tenth region 68 is located on straight line 4 along second region 33. Specifically, when viewed in the direction perpendicular to main surface 14, straight line 4 passing through one-side tenth region end portion 65 and other-side tenth region end portion 66 is along second region 33. When viewed in the direction perpendicular to main surface 14, straight line 4 passing through one-side tenth region end portion 65 and other-side tenth region end portion 66 is parallel to second direction 102. One-side eighth region end portion 55 is located between one-side fourth region end portion 45 and one-side tenth region end portion 65. Similarly, other-side eighth region end portion 56 is located between other-side fourth region end portion 46 and other-side tenth region end portion 66.

(Method of Measuring Composite Defect)

Next, a method of measuring composite defect 3 is described. For example, a photoluminescence imaging apparatus (model number: PLI-200) manufactured by Photon Design Corporation is used for observation of composite defect 3 including basal plane dislocation 40. When a measured region of silicon carbide epitaxial substrate 100 is irradiated with excitation light, photoluminescence is observed in the measured region. For example, a mercury xenon lamp is employed as an excitation light source. The excitation light from the light source passes through a 313-nm band pass filter and is emitted to the measured region. Photoluminescence having a wavelength of not less than 750 nm reaches a light receiving element such as a camera. As set forth above, a photoluminescence image of the measured region is shot.

Extended defect 30 has a polytype of 3C, for example. On the other hand, silicon carbide epitaxial film 20 has a polytype of 4H, for example. Extended defect 30 having a polytype of 3C has lower light emission intensity than silicon carbide epitaxial film 20 having a polytype of 4H. Thus, extended defect 30 having a polytype of 3C emits darker light than silicon carbide epitaxial film 20 having a polytype of 4H. On the other hand, basal plane dislocation 40 has higher light emission intensity than silicon carbide epitaxial film 20 having a polytype of 4H. Thus, basal plane dislocation 40 emits the brightest light.

A photoluminescence image of main surface 14 is shot while silicon carbide epitaxial substrate 100 is moved, for example, in a direction parallel to main surface 14 of silicon carbide epitaxial film 20. One field of view has an area of 2.6 mm×2.6 mm, for example. The photoluminescence image over the entire region of main surface 14 is thereby mapped. Composite defect 3 is identified in the acquired photoluminescence image. The area of quadrangle 5 circumscribed around identified composite defect 3 is determined. If there are a plurality of composite defects 3, the total area of quadrangle 5 circumscribed around each of the plurality of composite defects 3 is determined. By dividing the total area of quadrangles 5 circumscribed around composite defects 3 (second area) by the area of main surface 14 (first area), a value obtained by dividing the second area by the first area is calculated.

(Apparatus of Manufacturing Silicon Carbide Epitaxial Substrate)

Next, the configuration of an apparatus 200 of manufacturing silicon carbide epitaxial substrate 100 according to the present embodiment is described.

Figure 10:
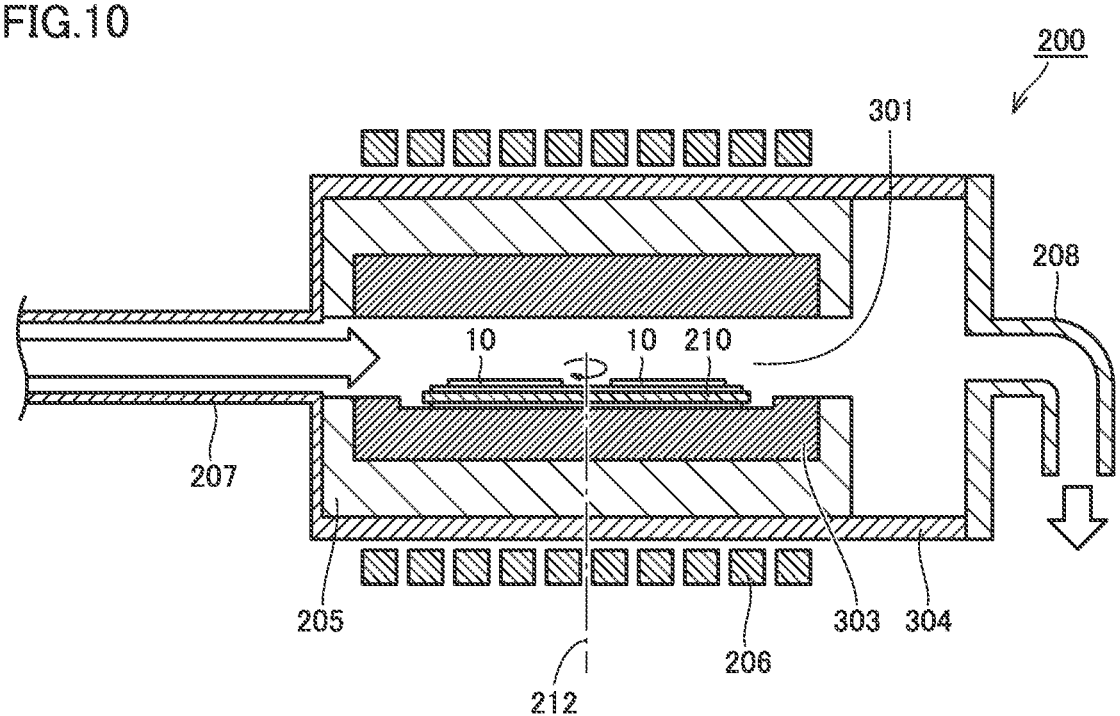
FIG. 10 is a schematic cross-sectional view showing the configuration of an apparatus of manufacturing the silicon carbide epitaxial substrate according to the present embodiment.

As shown in FIG. 10, apparatus 200 of manufacturing silicon carbide epitaxial substrate 100 is a hot wall type lateral CVD (Chemical Vapor Deposition) apparatus, for example. Manufacturing apparatus 200 mainly includes a reaction chamber 301, a heating element 303, a quartz tube 304, a heat insulator 205, and an induction heating coil 206.

Heating element 303 has a cylindrical shape, for example, and forms reaction chamber 301 therein. Heating element 303 is made of graphite, for example. Heat insulator 205 surrounds the outer circumference of heating element 303. Heat insulator 205 is provided in quartz tube 304 so as to make contact with an inner circumferential surface of quartz tube 304. Induction heating coil 206 is wound along an outer circumferential surface of quartz tube 304, for example. Induction heating coil 206 is configured to be able to supply an alternating current from an external power supply (not shown). Heating element 303 is thereby inductively heated. As a result, reaction chamber 301 is heated by heating element 303.

Reaction chamber 301 is a space formed by being surrounded by heating element 303. Reaction chamber 301 has silicon carbide substrate 10 disposed therein. Reaction chamber 301 is configured to be able to heat silicon carbide substrate 10. Reaction chamber 301 is provided with a susceptor 210 to hold silicon carbide substrate 10. Susceptor 210 is configured to be able to rotate around its rotation axis 212.

Manufacturing apparatus 200 includes a gas inlet port 207 and a gas outlet port 208. Gas outlet port 208 is connected to an air exhaust pump (not shown). Arrows in FIG. 6 indicate a flow of gas. Gas is introduced through gas inlet port 207 into reaction chamber 301, and exhausted through gas outlet port 208. A pressure in reaction chamber 301 is adjusted by a balance between an amount of supplied gas and an amount of exhausted gas.

Manufacturing apparatus 200 includes a gas supply unit (not shown) configured to be able to supply mixed gas including silane ($SiH_4$), propane ($C_3H_8$), ammonia ($NH_3$) and hydrogen ($H_2$), for example, to reaction chamber 301. Specifically, the gas supply unit may include a gas cylinder capable of supplying propane gas, a gas cylinder capable of supplying hydrogen gas, a gas cylinder capable of supplying silane gas, and a gas cylinder capable of supplying ammonia gas. Manufacturing apparatus 200 may include a preliminary heating unit (not shown) capable of heating only hydrogen gas, which is carrier gas, before the gas is supplied to reaction chamber 301.

(Method of Manufacturing Silicon Carbide Epitaxial Substrate)

Next, a method of manufacturing silicon carbide epitaxial substrate 100 according to the present embodiment is described.

First, a step of preparing silicon carbide substrate 10 is performed. A silicon carbide single crystal having a polytype of 4H is manufactured by sublimation, for example. Then, the silicon carbide single crystal is sliced by a wire saw, for example, and accordingly silicon carbide substrate 10 is prepared. Silicon carbide substrate 10 includes an n type impurity such as nitrogen. Silicon carbide substrate 10 has n type conductivity, for example.

Silicon carbide substrate 10 has first main surface 11, and second main surface 12 opposite to first main surface 11. First main surface 11 is a surface inclined at off angle $\theta 2$ in the off direction relative to the {0001} plane, for example. Off angle $\theta 2$ is not less than 2° and not more than 6°. The off direction is the <11–20> direction, for example. First main surface 11 of silicon carbide substrate 10 has a maximum diameter of not less than 150 mm, for example.

Next, a mechanical polishing step is performed. In the mechanical polishing step, mechanical polishing is performed on first main surface 11 of silicon carbide substrate 10. Specifically, silicon carbide substrate 10 is held in a polishing head such that first main surface 11 faces a surface plate. Slurry containing abrasive grains is supplied between the surface plate and first main surface 11. The abrasive grains are diamond abrasive grains, for example. Mechanical polishing is also performed on second main surface 12, as was performed on first main surface 11.

Next, a chemical mechanical polishing step is performed. In the chemical mechanical polishing step, chemical mechanical polishing is performed on first main surface 11 of silicon carbide substrate 10. Specifically, silicon carbide substrate 10 is held in a polishing head such that first main surface 11 faces a surface plate. Slurry containing abrasive grains is supplied between the surface plate and first main surface 11. The abrasive grains are diamond abrasive grains, for example. The slurry contains a hydrogen peroxide solution (oxidizing agent), for example. Chemical mechanical polishing is also performed on second main surface 12, as was performed on first main surface 11.

After the chemical mechanical polishing step, silicon carbide substrate 10 is warped. When silicon carbide substrate 10 is disposed on a plane such that second main surface 12 of silicon carbide substrate 10 is in contact with the plane, silicon carbide substrate 10 is warped such that a center 203 of second main surface 12 is in contact with the plane and an outer edge 201 of second main surface 12 is spaced from the plane. First main surface 11 is bent along the shape of second main surface 12.

Figure 11:
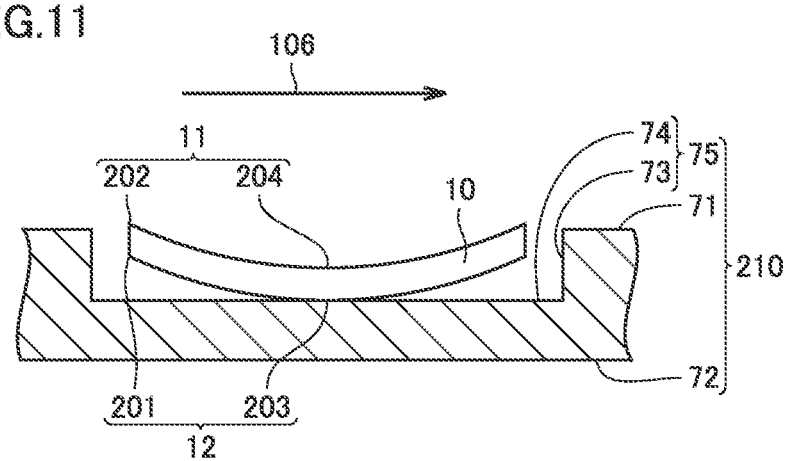
FIG. 11 is a schematic cross-sectional view showing a first step of a method of manufacturing the silicon carbide epitaxial substrate according to the present embodiment.

As shown in FIG. 11, silicon carbide substrate 10 is disposed on a susceptor 210. An upper surface 71 of susceptor 210 is provided with a substrate disposition portion 75 in recessed form. Substrate disposition portion 75 is formed of a substrate installation surface 74 and an inner circumferential surface 73. Silicon carbide substrate 10 is disposed in substrate disposition portion 75 such that second main surface 12 is in contact with substrate installation surface 74. Center 203 of second main surface 12 is in contact with substrate installation surface 74, whereas outer edge 201 of second main surface 12 is spaced from substrate installation surface 74. A lower surface 72 of susceptor 210 faces heating element 303.

Next, reaction chamber 301 is raised in temperature to about 1630° C., for example. Next, mixed gas including silane, propane, ammonia and hydrogen, for example, is introduced into reaction chamber 301. Specifically, a flow rate of silane gas is adjusted to 115 sccm, for example. A flow rate of propane gas is adjusted to 57.6 sccm, for example. A flow rate of ammonia gas is adjusted to $2.5 \times 10^{-2}$ sccm, for example. A flow rate of hydrogen gas is adjusted to 100 slm. The mixed gas flows along a direction of an arrow 106 in a region facing first main surface 11 of silicon carbide substrate 10. By introducing the mixed gas into reaction chamber 301, silicon carbide epitaxial film 20 is formed on first main surface 11 of silicon carbide substrate 10 by epitaxial growth (see FIG. 12).

Figure 12:
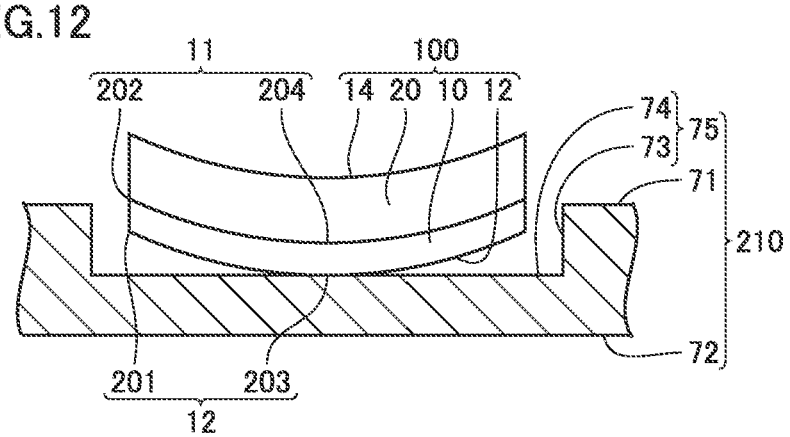
FIG. 12 is a schematic cross-sectional view showing a second step of the method of manufacturing the silicon carbide epitaxial substrate according to the present embodiment.

The warpage of silicon carbide substrate 10 such that center 203 of second main surface 12 of silicon carbide substrate 10 is in contact with substrate installation surface 74 and outer edge 201 of second main surface 12 is spaced from substrate installation surface 74, as shown in FIGS. 11 and 12, causes temperature at center 203 of second main surface 12 to be relatively high due to heat conduction from susceptor 210. In addition, the flow of source material gas and carrier gas into the region facing first main surface 11 of silicon carbide substrate 10 causes temperature at a center 204 of first main surface 11 to be relatively low. That is, in the center of silicon carbide substrate 10, a temperature difference occurs in a thickness direction. It is believed that the greater the temperature difference, the more likely it is for above-described composite defect 3 to occur.

In the method of manufacturing silicon carbide epitaxial substrate 100 according to the present embodiment, by increasing the temperature difference in the thickness direction around the center of silicon carbide substrate 10, and reducing the temperature difference in the thickness direction around the outer edge of silicon carbide substrate 10, composite defects 3 were concentrated around the center of silicon carbide substrate 10, and were prevented from occurring around the outer edge. The occurrence of composite defects 3 around the outer edge results in a reduced effective area (region without arrays of basal plane dislocations 40) of silicon carbide epitaxial substrate 100.

Specifically, assume that temperature at outer edge 201 of second main surface 12 is a first temperature, temperature at an outer edge 202 of first main surface 11 is a second temperature, temperature at center 203 of second main surface 12 is a third temperature, and temperature at center 204 of first main surface 11 is a fourth temperature. When introducing the mixed gas into reaction chamber 301, silicon carbide substrate 10 is heated so as to increase a temperature difference between the third temperature and the fourth temperature. Specifically, silicon carbide substrate 10 is heated such that the third temperature is higher than the fourth temperature. The temperature difference obtained by subtracting the fourth temperature from the third temperature is not less than 0° C. and not more than 1° C., for example. In addition, when introducing the mixed gas into reaction chamber 301, silicon carbide substrate 10 is heated so as to reduce a temperature difference between the first temperature and the second temperature. The temperature difference obtained by subtracting the second temperature from the first temperature is not more than 1° C., for example. When introducing the mixed gas into reaction chamber 301, silicon carbide substrate 10 is heated so as to reduce a temperature difference between the fourth temperature and the second temperature. The temperature difference obtained by subtracting the second temperature from the fourth temperature is not more than 10° C., for example. Each of the first temperature, the second temperature, the third temperature and the fourth temperature is not less than 1500° C. and not more than 1700° C., for example.

Before introducing the mixed gas into reaction chamber 301, preliminary heating is performed on the carrier gas (hydrogen gas) carrying the source material gas. The temperature of the mixed gas introduced onto silicon carbide substrate 10 can thereby be raised. By raising the temperature of the mixed gas, the temperature difference in the thickness direction around the outer edge of silicon carbide substrate 10 can be reduced. Thus, the occurrence of composite defects 3 around the outer edge of silicon carbide substrate 10 can be suppressed. The preliminary heating is performed only on the carrier gas.

(Method of Manufacturing Silicon Carbide Semiconductor Device)

Next, a method of manufacturing a silicon carbide semiconductor device 300 according to the present embodiment is described.

Figure 13:
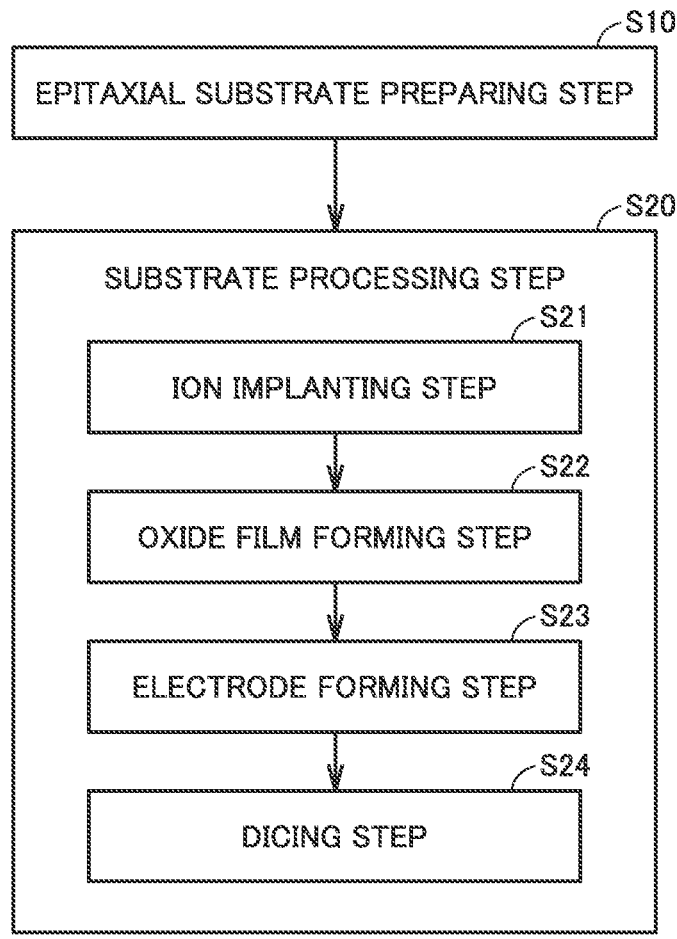
FIG. 13 is a flowchart schematically showing a method of manufacturing a silicon carbide semiconductor device according to the present embodiment.

The method of manufacturing the silicon carbide semiconductor device according to the present embodiment mainly includes an epitaxial substrate preparing step (S10: FIG. 13) and a substrate processing step (S20: FIG. 13).

First, the epitaxial substrate preparing step (S10: FIG. 13) is performed. Specifically, silicon carbide epitaxial substrate 100 is prepared with the above-described method of manufacturing silicon carbide epitaxial substrate 100 (see FIG. 1).

Next, the substrate processing step (S20: FIG. 13) is performed. Specifically, silicon carbide epitaxial substrate 100 is processed, and accordingly a silicon carbide semiconductor device is manufactured. The "processing" includes various types of processing such as ion implantation, heat treatment, etching, oxide film formation, electrode formation, and dicing. That is, the substrate processing step may include at least one of the types of processing including ion implantation, heat treatment, etching, oxide film formation, electrode formation, and dicing.

Described below is a method of manufacturing a MOSFET (Metal Oxide Semiconductor Field Effect Transistor) as an example of the silicon carbide semiconductor device. The substrate processing step (S20: FIG. 13) includes, for example, an ion implanting step (S21: FIG. 13), an oxide film forming step (S22: FIG. 13), an electrode forming step (S23: FIG. 13), and a dicing step (S24: FIG. 13).

Figure 14:
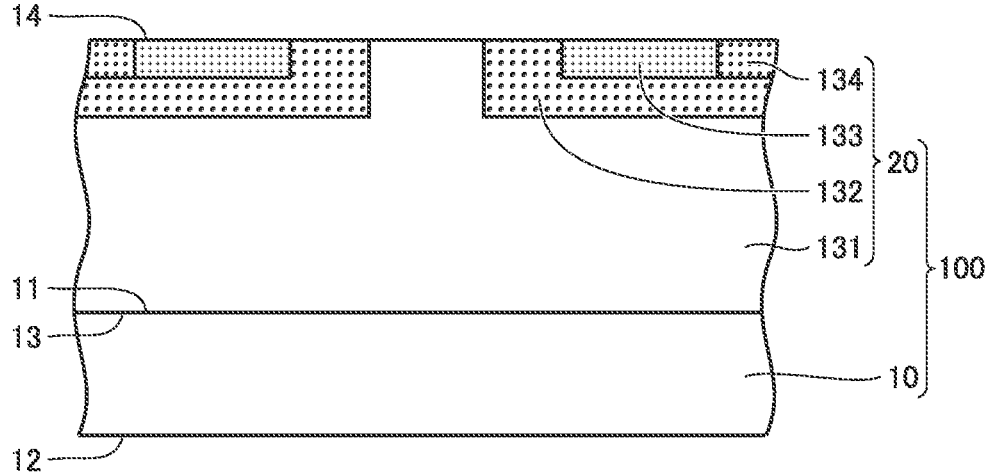
FIG. 14 is a schematic cross-sectional view showing a first step of the method of manufacturing the silicon carbide semiconductor device according to the present embodiment.

First, the ion implanting step (S21: FIG. 13) is performed. A p type impurity such as aluminum (Al) is implanted into main surface 14 on which a mask (not shown) with an opening has been formed. Consequently, a body region 132 having p type conductivity is formed. Then, an n type impurity such as phosphorus (P) is implanted into a prescribed position within body region 132. Consequently, a source region 133 having n type conductivity is formed. Then, a p type impurity such as aluminum is implanted into a prescribed position within source region 133. Consequently, a contact region 134 having p type conductivity is formed (see FIG. 14).

In silicon carbide epitaxial film 20, a portion other than body region 132, source region 133 and contact region 134 serves as a drift region 131. Source region 133 is separated from drift region 131 by body region 132. The ion implantation may be performed while silicon carbide epitaxial substrate 100 is heated to not less than about 300° C. and not more than about 600° C. After the ion implantation, activation annealing is performed on silicon carbide epitaxial substrate 100. The activation annealing activates the impurities implanted into silicon carbide epitaxial film 20, to generate a carrier in each region. The activation annealing is performed in an argon (Ar) atmosphere, for example. The activation annealing is performed at a temperature of about 1800° C., for example. The activation annealing is performed for a period of about 30 minutes, for example.

Figure 15:
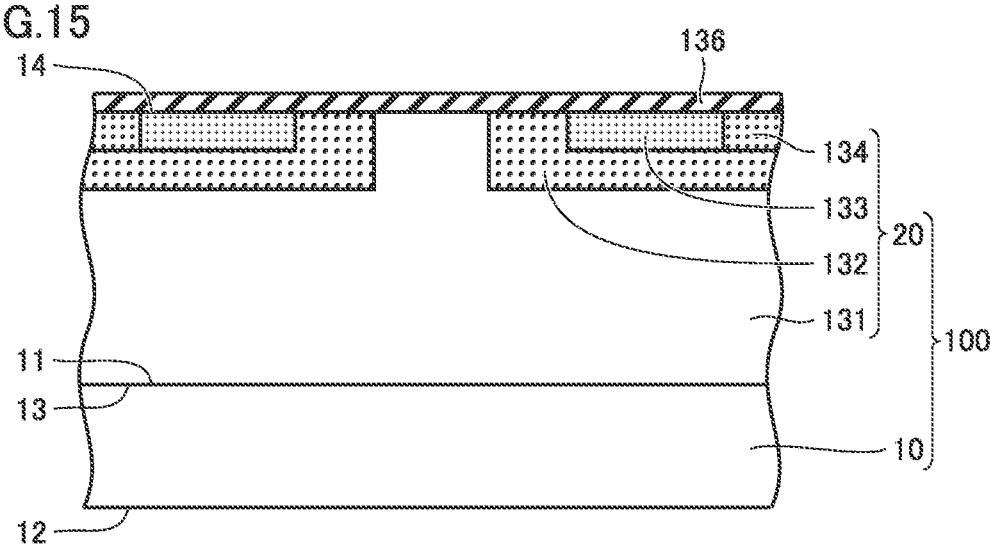
FIG. 15 is a schematic cross-sectional view showing a second step of the method of manufacturing the silicon carbide semiconductor device according to the present embodiment.

Next, the oxide film forming step (S22: FIG. 13) is performed. Silicon carbide epitaxial substrate 100 is heated in an atmosphere including oxygen, for example, and accordingly an oxide film 136 is formed on main surface 14 (see FIG. 15). Oxide film 136 is made of silicon dioxide, for example. Oxide film 136 functions as a gate insulating film. The thermal oxidation process is performed at a temperature of about 1300° C., for example. The thermal oxidation process is performed for a period of about 30 minutes, for example.

After oxide film 136 is formed, heat treatment may be further performed in a nitrogen atmosphere. For example, heat treatment is performed in an atmosphere of nitrogen monoxide at about 1100° C. for about one hour. Subsequently, heat treatment is further performed in an argon atmosphere. For example, heat treatment is performed in an argon atmosphere at not less than about 1100° C. and not more than about 1500° C. for about one hour.

Next, the electrode forming step (S23: FIG. 13) is performed. Specifically, a gate electrode 141 is formed on oxide film 136. Gate electrode 141 is formed by CVD (Chemical Vapor Deposition), for example. Gate electrode 141 is made of conductive polysilicon, for example. Gate electrode 141 is formed at a position facing source region 133 and body region 132.

Next, an interlayer insulating film 137 is formed to cover gate electrode 141. Interlayer insulating film 137 is formed by CVD, for example. Interlayer insulating film 137 is made of silicon dioxide, for example. Interlayer insulating film 137 is formed in contact with gate electrode 141 and oxide film 136. Then, oxide film 136 and interlayer insulating film 137 are partially removed by etching. Consequently, source region 133 and contact region 134 are exposed at oxide film 136.

Next, a source electrode 142 is formed at this exposed portion by sputtering, for example. Source electrode 142 is made of titanium, aluminum and silicon, for example. After source electrode 142 is formed, source electrode 142 and silicon carbide epitaxial substrate 100 are heated at a temperature of not less than about 900° C. and not more than about 1100° C., for example. Consequently, source electrode 142 and silicon carbide epitaxial substrate 100 are brought into ohmic contact with each other. Then, a wiring layer 138 is formed in contact with source electrode 142. Wiring layer 138 is made of a material including aluminum, for example. Next, a drain electrode 143 is formed on second main surface 12. Drain electrode 143 is made of an alloy including nickel and silicon, for example (NiSi, for example).

Figure 16:
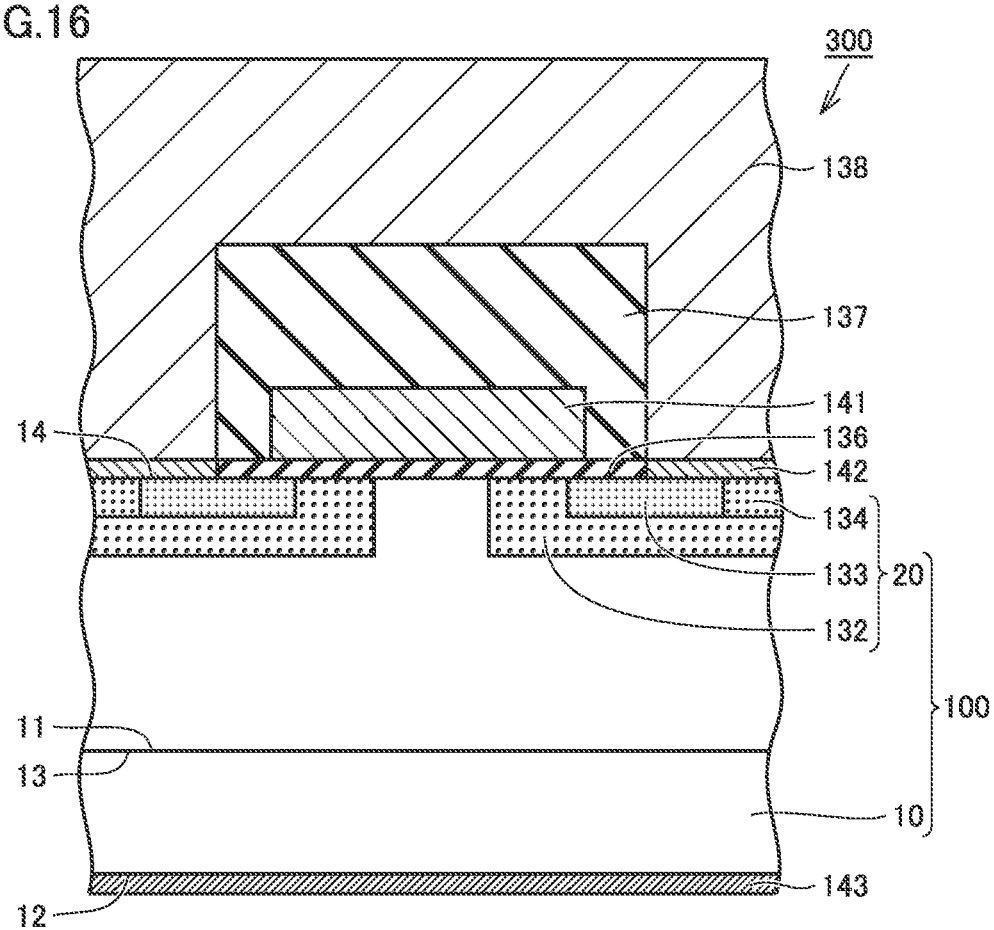
FIG. 16 is a schematic cross-sectional view showing the configuration of the silicon carbide semiconductor device according to the present embodiment.

Next, the dicing step (S24: FIG. 13) is performed. Silicon carbide epitaxial substrate 100 is diced along dicing lines, for example, and accordingly silicon carbide epitaxial substrate 100 is divided into a plurality of semiconductor chips. As set forth above, silicon carbide semiconductor device 300 is manufactured (see FIG. 16).

Although the method of manufacturing the silicon carbide semiconductor device according to the present disclosure has been described above with reference to a planar MOSFET as an example, the manufacturing method according to the present disclosure is not limited as such. The manufacturing method according to the present disclosure can be applied to silicon carbide semiconductor devices such as a trench MOSFET, an IGBT (Insulated Gate Bipolar Transistor), an SBD (Schottky Barrier Diode), a thyristor, a GTO (Gate Turn Off thyristor), and a PN diode.

Next, functions and effects of silicon carbide epitaxial substrate 100 and the method of manufacturing silicon carbide semiconductor device 300 according to the present embodiment will be described.

Silicon carbide epitaxial substrate 100 according to the present embodiment includes silicon carbide substrate 10, silicon carbide epitaxial film 20, and composite defect 3. When the area of main surface 14 is the first area, and the area of quadrangle 5 circumscribed around composite defect 3 is the second area, the value obtained by dividing the second area by the first area is not more than 0.001. Accordingly, the reliability of a silicon carbide semiconductor device manufactured with silicon carbide epitaxial substrate 100 can be improved. Specifically, when a forward bias is applied to a PN diode, for example, holes diffuse from a P type semiconductor to an N type semiconductor, and electrons diffuse from the N type semiconductor to the holes, causing a flow of a diffusion current. When the holes impinge on basal plane dislocation 40 of composite defect 3, basal plane dislocation 40 turns into a stacking fault. An increase in the number of stacking faults causes an increase in resistance of the PN diode. That is, when a current continues to be passed in a forward direction, the number of stacking faults increases gradually, causing an increase in resistance of the PN diode. By setting the value obtained by dividing the second area by the first area to not more than 0.001, the increase in the number of stacking faults can be suppressed in the silicon carbide semiconductor device.

In addition, in silicon carbide epitaxial substrate 100 according to the present embodiment, silicon carbide epitaxial film 20 has a thickness of not less than 15 μm. It is believed that, when silicon carbide epitaxial film 20 has a thickness of not less than 15 μm, stress within silicon carbide epitaxial film 20 increases, raising the likelihood of occurrence of composite defect 3. In silicon carbide epitaxial substrate 100 according to the present embodiment, even with the film thickness that raises the likelihood of occurrence of composite defect 3, the occurrence of composite defect 3 can be suppressed.

Silicon carbide substrate 10 may be significantly distorted around the outer edge due to beveling. When silicon carbide epitaxial film 20 is formed on this silicon carbide substrate 10, multiple arrays of basal plane dislocations may grow around the outer edge due to the distortion. When composite defects 3 occur around the outer edge, even more arrays of basal plane dislocations grow around the outer edge. When the arrays of basal plane dislocations grow longer, the effective area (region without the arrays of basal plane dislocations) of silicon carbide epitaxial substrate 100 is reduced. In silicon carbide epitaxial substrate 100 according to the present embodiment, composite defects 3 are located within the circle centered at the center of main surface 14 and having a radius which is two-thirds the radius of main surface 14. That is, composite defects 3 are intentionally generated around the center of main surface 14, and are prevented from occurring around the outer edge of main surface 14. Accordingly, the growth of arrays of basal plane dislocations can be suppressed around the outer edge. In addition, an increased thickness of silicon carbide epitaxial film 20 causes a longer array of basal plane dislocations. Thus, when silicon carbide epitaxial film 20 has a great thickness, it is more desirable that composite defects 3 be intentionally generated around the center of main surface 14, and be prevented from occurring around the outer edge of main surface 14.

Example (Preparation of Samples)

First, silicon carbide epitaxial substrates 100 according to samples 1 to 8 were prepared. Silicon carbide epitaxial substrates 100 according to samples 1 to 4 were comparative examples. Silicon carbide epitaxial substrates 100 according to samples 5 to 8 were examples. The silicon carbide epitaxial substrates according to samples 1 to 8 were manufactured in accordance with the above-described method of manufacturing silicon carbide epitaxial substrate 100, except for the following conditions. Silicon carbide epitaxial substrates 100 according to samples 1 to 4 were manufactured under a manufacturing condition A. Silicon carbide epitaxial substrates 100 according to samples 5 to 8 were manufactured under a manufacturing condition B. Silicon carbide epitaxial substrates 100 according to samples 1 to 8 had a diameter of 150 mm.

Manufacturing condition A and manufacturing condition B differed in temperature conditions in the step of forming silicon carbide epitaxial film 20 on silicon carbide substrate 10. In manufacturing condition A, the temperature at outer edge 201 of second main surface 12 (first temperature) was set at 1550° C., the temperature at outer edge 202 of first main surface 11 (second temperature) was set at 1540° C., the temperature at center 203 of second main surface 12 (third temperature) was set at 1590° C., and the temperature at center 204 of first main surface 11 (fourth temperature) was set at 1585° C. (see FIG. 11). In manufacturing condition B, the temperature at outer edge 201 of second main surface 12 (first temperature) was set at 1596° C., the temperature at outer edge 202 of first main surface 11 (second temperature) was set at 1595° C., the temperature at center 203 of second main surface 12 (third temperature) was set at 1600° C., and the temperature at center 204 of first main surface 11 (fourth temperature) was set at 1599° C. (see FIG. 11).

Silicon carbide epitaxial film 20 of silicon carbide epitaxial substrate 100 according to each of samples 1 and 5 had a thickness of 10 μm. Silicon carbide epitaxial film 20 of silicon carbide epitaxial substrate 100 according to each of samples 2 and 6 had a thickness of 12 μm. Silicon carbide epitaxial film 20 of silicon carbide epitaxial substrate 100 according to each of samples 3 and 7 had a thickness of 15 Jim. Silicon carbide epitaxial film 20 of silicon carbide epitaxial substrate 100 according to each of samples 4 and 8 had a thickness of 30 μm.

TABLE 1

| Sample No. | Manufacturing condition | Thickness of silicon carbide epitaxial film | Second area/ First area |
|---|---|---|---|
| Sample 1 | Condition A | 10 μm | 0 |
| Sample 2 | Condition A | 12 μm | 0 |
| Sample 3 | Condition A | 15 μm | 0.002 |
| Sample 4 | Condition A | 30 μm | 0.005 |
| Sample 5 | Condition B | 10 μm | 0 |
| Sample 6 | Condition B | 12 μm | 0 |
| Sample 7 | Condition B | 15 μm | 0.0002 |
| Sample 8 | Condition B | 30 μm | 0.0005 |

(Method of Evaluation)

Next, silicon carbide epitaxial substrates 100 according to samples 1 to 8 were observed for the presence or absence of composite defects. The observation of composite defects 3 was conducted in accordance with the above-described method of measuring composite defect 3. If there were composite defects 3 in silicon carbide epitaxial substrate 100, the total area of quadrangles 5 circumscribed around composite defects 3 (second area) was divided by the area of main surface 14 (first area), to calculate a value obtained by dividing the second area by the first area. The first area was set at 7.5×7.5×3.14 (cm²).

(Results of Evaluation)

Table 1 shows the value obtained by dividing the second area by the first area in each of silicon carbide epitaxial substrates 100 according to samples 1 to 8. Composite defects 3 were observed when silicon carbide epitaxial film 20 had a thickness of not less than 15 μm. On the other hand, composite defects 3 were not observed when silicon carbide epitaxial film 20 had a thickness of not more than 12 μm. As shown in Table 1, the value obtained by dividing the second area by the first area in each of silicon carbide epitaxial substrates 100 according to samples 3 and 4 was more than 0.001. On the other hand, the value obtained by dividing the second area by the first area in each of silicon carbide epitaxial substrates 100 according to samples 7 and 8 was not more than 0.001.

It should be understood that the embodiment and example disclosed herein are illustrative and non-restrictive in every respect. The scope of the present invention is defined by the terms of the claims rather than the embodiment and example described above, and is intended to include any modifications within the scope and meaning equivalent to the terms of the claims.

REFERENCE SIGNS LIST

1 origin; 2 center; 3 composite defect; 4 straight line; 5 quadrangle; 6 inner peripheral region; 7 outer peripheral region; 8 upper end portion; 10 silicon carbide substrate; 11 first main surface; 12 second main surface; 13 third main surface; 14 main surface; 15 recess; 16 circle; 17 orientation flat; 18 arc-shaped portion; 19 outer edge portion; 20 silicon carbide epitaxial film; 30 extended defect; 31 first side portion; 32 second side portion; 33 second region; 34 first region; 35 side portion; 36 inclined portion; 37 third side portion; 38 fourth side portion; 39 fifth region; 40 basal plane dislocation; 41 one-side third region portion; 42 one-side fourth region portion; 43 other-side third region portion; 44 other-side fourth region portion; 45 one-side fourth region end portion; 46 other-side fourth region end portion; 47 third region; 48 fourth region; 49, 59, 69 end portion; 51 one-side seventh region portion; 52 one-side eighth region portion; 53 other-side seventh region portion; 54 other-side eighth region portion; 55 one-side eighth region end portion; 56 other-side eighth region end portion; 57 seventh region; 58 eighth region; 61 one-side ninth region portion; 62 one-side tenth region portion; 63 other-side ninth region portion; 64 other-side tenth region portion; 65 one-side tenth region end portion; 66 other-side tenth region end portion; 67 ninth region; 68 tenth region; 71 upper surface; 72 lower surface; 73 inner circumferential surface; 74 substrate installation surface; 75 substrate disposition portion; 100 silicon carbide epitaxial substrate; 101 first direction; 102 second direction; 103 third direction; 104 fourth direction; 105 fifth direction; 106 arrow; 111 maximum diameter; 112, 113 radius; 114 thickness; 115 short side; 116 long side; 131 drift region; 132 body region; 133 source region; 134 contact region; 136 oxide film; 137 interlayer insulating film; 138 wiring layer; 141 gate electrode; 142 source electrode; 143 drain electrode; 200 manufacturing apparatus; 201 outer edge of second main surface; 202 outer edge of first main surface; 203 center of second main surface; 204 center of first main surface; 205 heat insulator; 206 induction heating coil; 207 gas inlet port; 208 gas outlet port; 210 susceptor; 212 rotation axis; 300 silicon carbide semiconductor device; 301 reaction chamber; 303 heating element; 304 quartz tube.

The invention claimed is:

1. A silicon carbide epitaxial substrate comprising:
a silicon carbide substrate;
a silicon carbide epitaxial film on the silicon carbide substrate; and
a composite defect in the silicon carbide epitaxial film,
a main surface of the silicon carbide epitaxial film being a surface inclined at an off angle of not less than 2° and not more than 6° relative to a {0001} plane,
the composite defect including an extended defect and a basal plane dislocation,
the extended defect including a first region extending in a <11-20> direction from an origin located at a boundary between the silicon carbide substrate and the silicon carbide epitaxial film, and a second region extending along a <1-100> direction,
the first region having a width in the <1-100> direction that increases from the origin toward the second region,
the extended defect being made of silicon carbide having a polytype different from a polytype of silicon carbide forming the silicon carbide epitaxial film,
the basal plane dislocation including a third region continuous to the origin and extending along the <1-100> direction, and a fourth region extending along a direction intersecting the <1-100> direction,
when viewed in a direction perpendicular to the main surface, an end portion of the fourth region being located on a straight line along the second region, and
when an area of the main surface is a first area, and an area of a quadrangle circumscribed around the composite defect is a second area, a value obtained by dividing the second area by the first area being not more than 0.001.

2. The silicon carbide epitaxial substrate according to claim 1, wherein
the silicon carbide epitaxial film has a thickness of not less than 15 μm.

3. The silicon carbide epitaxial substrate according to claim 1, wherein
there are silicon carbide particles at the origin.

4. The silicon carbide epitaxial substrate according to claim 1, wherein
there are carbon particles at the origin.

5. The silicon carbide epitaxial substrate according to claim 1, wherein
the composite defect is located within a circle centered at a center of the main surface and having a radius which is two-thirds a radius of the main surface.

6. A method of manufacturing a silicon carbide semiconductor device, comprising:
preparing the silicon carbide epitaxial substrate according to claim 1; and
processing the silicon carbide epitaxial substrate.

* * * * *